United States Patent
Seong et al.

(10) Patent No.: US 8,202,751 B2
(45) Date of Patent: *Jun. 19, 2012

(54) FLIP-CHIP LIGHT EMITTING DIODES AND METHOD OF MANUFACTURING THEREOF

(75) Inventors: Tae-Yeon Seong, Gwangju (KR); June-O Song, Gwangju (KR); Kyoung-Kook Kim, Siheung (KR); Woong-Ki Hong, Gwangju (KR)

(73) Assignee: Samsung LED Co., Ltd., Gyunggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/926,638

(22) Filed: Dec. 1, 2010

(65) Prior Publication Data
US 2011/0086448 A1    Apr. 14, 2011

Related U.S. Application Data

(62) Division of application No. 11/632,279, filed as application No. PCT/KR2005/002245 on Jul. 12, 2005, now Pat. No. 7,872,271.

(30) Foreign Application Priority Data

| Jul. 12, 2004 | (KR) | 10-2004-0054141 |
| Jul. 23, 2004 | (KR) | 10-2004-0057571 |
| Jul. 23, 2004 | (KR) | 10-2004-0057576 |
| Jul. 23, 2004 | (KR) | 10-2004-0057582 |
| Jul. 23, 2004 | (KR) | 10-2004-0057591 |

(51) Int. Cl.
*H01L 21/00* (2006.01)
(52) U.S. Cl. .................. 438/46; 257/E21.006
(58) Field of Classification Search .............. 438/46, 438/27
See application file for complete search history.

(56) References Cited

U.S. PATENT DOCUMENTS 6,822,272 B2    11/2004  Yanamoto
(Continued)

FOREIGN PATENT DOCUMENTS

EP    0926744    6/1999
(Continued)

OTHER PUBLICATIONS

Office Action dated Mar. 16, 2010 issued in corresponding Japanese Application No. 2007-521401 and English translation thereof.

(Continued)

*Primary Examiner* — Wai Sing Louie
*Assistant Examiner* — Bilkis Jahan
(74) *Attorney, Agent, or Firm* — Harness, Dickey & Pierce, P.L.C.

(57) ABSTRACT

Provided are a flip-chip nitride-based light emitting device having an n-type clad layer, an active layer and a p-type clad layer sequentially stacked thereon, comprising a reflective layer formed on the p-type clad layer and at least one transparent conductive thin film layer made up of transparent conductive materials capable of inhibiting diffusion of materials constituting the reflective layer, interposed between the p-type clad layer and reflective layer; and a process for preparing the same. In accordance with the flip-chip nitride-based light emitting device of the present invention and a process for preparing the same, there are provided advantages such as improved ohmic contact properties with the p-type clad layer, leading to increased wire bonding efficiency and yield upon packaging the light emitting device, capability to improve luminous efficiency and life span of the device due to low specific contact resistance and excellent current-voltage properties.

7 Claims, 4 Drawing Sheets

U.S. PATENT DOCUMENTS

| | | | |
|---|---|---|---|
| 7,042,012 B2 * | 5/2006 | Senda et al. | 257/79 |
| 7,190,002 B2 | 3/2007 | Seong et al. | |
| 7,491,564 B2 * | 2/2009 | Seong et al. | 438/46 |
| 2002/0080463 A1 | 6/2002 | Tonar et al. | |
| 2002/0171087 A1 | 11/2002 | Krames | |
| 2003/0104705 A1 | 6/2003 | Fudeta et al. | |
| 2005/0001224 A1 | 1/2005 | Chen | |
| 2005/0121685 A1 | 6/2005 | Seong et al. | |
| 2005/0133803 A1 * | 6/2005 | Seong et al. | 257/96 |

FOREIGN PATENT DOCUMENTS

| | | |
|---|---|---|
| JP | 09-129919 | 5/1997 |
| JP | 10-020320 | 1/1998 |
| JP | 10-173222 | 6/1998 |
| JP | 11-191641 | 7/1999 |
| JP | 2000-294837 | 10/2000 |
| JP | 2002-353499 | 12/2002 |
| JP | 2003-124518 | 4/2003 |
| JP | 2003-163373 | 6/2003 |
| JP | 2004-179347 | 6/2004 |
| JP | 2004-179365 | 6/2004 |

OTHER PUBLICATIONS

Office Action dated Oct. 25, 2010 issued in corresponding Japanese Application No. 2007-521401 and English translation thereof.

Japanese Office Action dated Apr. 6, 2012 issued in co-pending Japanese Application No. 2007-521401 and English translation thereof.

* cited by examiner

FLIP-CHIP LIGHT EMITTING DIODES AND METHOD OF MANUFACTURING THEREOF

CROSS-REFERENCE TO RELATED APPLICATIONS

This application is a divisional under 35 U.S.C. §121 of U.S. application Ser. No. 11/632,279, filed on Dec. 19, 2007, now U.S. Pat. No. 7,872,271 which is a national stage application under 35 U.S.C. §371 of International Application No. PCT/KR2005/002245, filed on Jul. 12, 2005, which claims priority under 35 U.S.C. §119 to Korean Patent Application No. 10-2004-0054141, filed on Jul. 12, 2004, Korean Patent Application No. 10-2004-0057591, filed on Jul. 23, 2004, Korean Patent Application No. 10-2004-0057582, filed on Jul. 23, 2004, Korean Patent Application No. 10-2004-0057571, filed on Jul. 23, 2004, and Korean Patent Application No. 10-2004-0057576, filed on Jul. 23, 2004, the contents of each of which are herein incorporated by reference in their entireties.

TECHNICAL FIELD

The present invention relates to a flip-chip nitride-based light emitting device and a process for preparing the same. More specifically, the present invention relates to a flip-chip nitride-based light emitting device having an electrode structure capable of improving luminous efficiency and a process for preparing the same.

BACKGROUND

Ohmic contact structures between semiconductors and electrodes are very important in realization of light emitting devices such as light emitting diodes (LEDs) and laser diodes (LDs), utilizing nitride-based compound semiconductors, for example gallium nitride (GaN) semiconductors emitting blue and green light and UV light. At present, commercially available gallium nitride-based light emitting devices are primarily formed on an insulating sapphire ($Al_2O_3$) substrate.

Meanwhile, these gallium nitride-based light emitting devices are broadly divided into top-emitting light emitting diodes (TLEDs) and flip-chip light emitting diodes (FCLEDs).

Currently used top-emitting light emitting diodes are configured so as to emit light through ohmic electrode layers in contact with p-type clad layers.

In addition, top-emitting light emitting devices can overcome problems associated with poor electrical properties such as low current injection and current spreading resulting from thin film characteristics of p-type clad layers having a low hole concentration, via development of ohmic contact electrodes having transparency and a low sheet resistance value.

In general, for these top-emitting light emitting devices, oxidized semi-transparent nickel (Ni)/gold (Au) metal thin films are widely used as metal thin film structures based on transition metals such as nickel (Ni) metal.

Nickel (Ni)-based metal thin films are reported to form semi-transparent ohmic contact layers having a specific contact resistance of about $10^{-3}$ to $10^{-4}$ $\Omega cm^3$ when annealed under oxygen ($O_2$) atmosphere.

Such a low specific contact resistance of the ohmic contact layers, when annealed at a temperature of 500 to 600° C. under oxygen ($O_2$) atmosphere, leads to formation of nickel oxide (NiO), a p-type semiconductor oxide, between gold layers formed into an island shape and on top parts thereof, at an interface between p-type gallium nitride and nickel (Ni), which results in decreased Schottky barrier height (SBH) and thereby easy supply of dominant carrier holes around the surface of the gallium nitride layer leading to increase in an effective carrier concentration therearound. On the other hand, it is understood that annealing of nickel (Ni)/gold (Au) after contacting with p-type gallium nitride removes Mg—H intermetallic complexes, thus leading to an effective carrier concentration at the surface of the p-type gallium nitride layer of more than $10^{19}$ via a reactivation process that increases a concentration of magnesium dopant on the surface of the gallium nitride layer, which in turn causes inversion of tunneling between p-type gallium nitride and the electrode layer (an oxidized nickel layer containing gold), thereby exhibiting ohmic conduction characteristics.

However, top-emitting light emitting diodes utilizing semi-transparent electrode thin films made up of nickel/gold have low light-utilization efficiency, thus making it difficult to realize high-capacity, high-brightness light emitting devices.

Recently, in order to realize high-capacity, high-brightness light emitting devices, there is a need to develop flip-chip light emitting devices using silver (Ag), silver oxide ($Ag_2O$) or aluminum (Al) which are receiving a great deal of attention as materials for high reflective layers.

Meanwhile, such metal materials for reflective layers have high reflection efficiency and therefore can provide high transient luminous efficiency, but suffer from difficulty to form ohmic contacts having low resistance values due to low work function thereof, resulting in reduced life span of the device and poor adhesion to gallium nitride thus failing to provide stable device reliability.

More specifically reviewing problems associated with the use of silver and aluminum as materials for reflective layers:

Firstly, aluminum (Al) exhibits a low work function and easily forms nitrides (AlN) even at relatively low annealing temperatures, thus making it difficult to form ohmic contact with the p-type gallium nitride.

Next, silver (Ag) forms high quality ohmic contact and exhibits high reflectivity, but is heat-labile, thus suffering form difficulty to form high quality thin films via thin film forming processes. That is, silver (Ag) thin films exhibit agglomeration at the early stages of annealing due to heat-ability thereof and undergo changes into voids, hillocks and islands at the final stages of annealing, thus resulting in degradation of electrical and optical properties.

Recently, in order to extend applications of light emitting devices to high-brightness light emitting devices having large area and high capacity such as vehicle tail lights, domestic lighting and the like, extensive research into development of ohmic contact layers having a low specific contact resistance value while providing high reflectivity is being actively undertaken.

Mensz et al. have proposed nickel (Ni)/aluminum (Al) and nickel (Ni)/silver (Ag) structures as a bilayer structure (Electronics Letters 33 (24) pp. 2066), but these structures suffer from difficulty to form ohmic contacts and therefore raise problems associated with generation of large quantities of heat due to a high operation voltage upon operation of light emitting diodes.

Further, Michael R. Krames et al. have recently reported research and development of nickel (Ni)/silver (Ag) and gold (Au)/nickel oxide ($NiO_x$)/aluminum (Al) electrode structures (US Patent Publication No. 2002/0171087 A1). However, these electrode structures also have shortcomings such as low adhesion and reduced luminous efficiency due to reflective scattering.

DISCLOSURE

Technical Problem

Therefore, the present invention has been made in view of the above problems, and it is an object of the present invention to provide a flip-chip nitride-based light emitting device having excellent electrical properties via application of high quality ohmic contact electrodes having thermal stability and high reliability and a process for preparing the same.

Technical Solution

In accordance with a first embodiment of the present invention, the above and other objects can be accomplished by the provision of a flip-chip nitride-based light emitting device having an active layer between an n-type clad layer and a p-type clad layer, comprising a reflective layer formed on the p-type clad layer; and at least one transparent conductive thin film layer made up of transparent conductive materials capable of inhibiting diffusion of materials constituting the reflective layer, interposed between the p-type clad layer and reflective layer.

A flip-chip nitride-based light emitting device in accordance with a second embodiment of the present invention may further comprise an interface modification layer formed between the p-type clad layer and transparent conductive thin film layer.

A flip-chip nitride-based light emitting device in accordance with a third embodiment of the present invention may further comprise an insert metal layer formed between the interface modification layer and transparent conductive thin film layer.

Flip-chip nitride-based light emitting devices having an active layer between an n-type clad layer and a p-type clad layer, in accordance with fourth through sixth embodiments of the present invention, comprise a multi-ohmic contact layer including an interface modification layer and at least one transparent conductive thin film layer, as a stack repeat unit, stacked on the p-type clad layer; and a reflective layer made up of reflective materials on the multi-ohmic contact layer.

In order to achieve the above objects in accordance with the present invention, there is provided a process for preparing a flip-chip nitride-based light emitting device having an active layer between an n-type clad layer and a p-type clad layer, comprising:

a) forming at least one transparent conductive thin film layer on the p-type clad layer of a light emitting structure including the n-type clad layer, active layer and p-type clad layer sequentially stacked on a substrate;

b) forming a reflective layer on the transparent conductive thin film layer; and c) annealing the resulting structure including the reflective layer.

Preferably, the process for preparing a flip-chip nitride-based light emitting device may further comprise an annealing step after step a) prior to forming the reflective layer.

Further, in accordance with another process of the present invention, there is provided a process for preparing a flip-chip nitride-based light emitting device having an active layer between an n-type clad layer and a p-type clad layer, comprising:

a) forming an interface modification layer on the p-type clad layer of a light emitting structure including the n-type clad layer, active layer and p-type clad layer sequentially stacked on a substrate;

b) forming at least one transparent conductive thin film layer made up of transparent conductive materials on the interface modification layer;

c) forming a reflective layer on the transparent conductive thin film layer; and d) annealing the structure formed in step c).

Preferably, the above process may further comprise an annealing step after step b) prior to forming the reflective layer.

Preferably, the above process may further comprise forming an insert metal layer on the interface modification layer prior to forming the transparent conductive thin film layer.

Further, in accordance with a further process of the present invention, there is provided a process for preparing a flip-chip nitride-based light emitting device having an active layer between an n-type clad layer and a p-type clad layer, comprising:

a) forming a multi-ohmic contact layer via stacking of an interface modification layer and at least one transparent conductive thin film layer, as a stack repeat unit, on the p-type clad layer of a light emitting structure including the n-type clad layer, active layer and p-type clad layer sequentially stacked on a substrate;

b) forming a reflective layer on the multi-ohmic contact layer; and c) annealing the structure formed in step b).

Preferably, the above process may further comprise annealing the multi-ohmic contact layer after step a) prior to forming the reflective layer.

Advantageous Effects

As described hereinbefore, in accordance with a flip-chip nitride-based light emitting device of the present invention and a process for preparing the same, there are provided advantages such as improved ohmic contact properties with the p-type clad layer, leading to increased wire bonding efficiency and yield upon packaging the light emitting device, capability to improve luminous efficiency and life span of the device due to low specific contact resistance and excellent current-voltage properties.

BRIEF DESCRIPTION OF THE DRAWINGS

The above and other objects, features and other advantages of the present invention will be more clearly understood from the following detailed description taken in conjunction with the accompanying drawings, in which.

BEST MODE

Hereinafter, a flip-chip nitride-based light emitting device in accordance with preferred embodiments of the present invention will be described in more detail with reference to the accompanying drawings.

Figure 1:
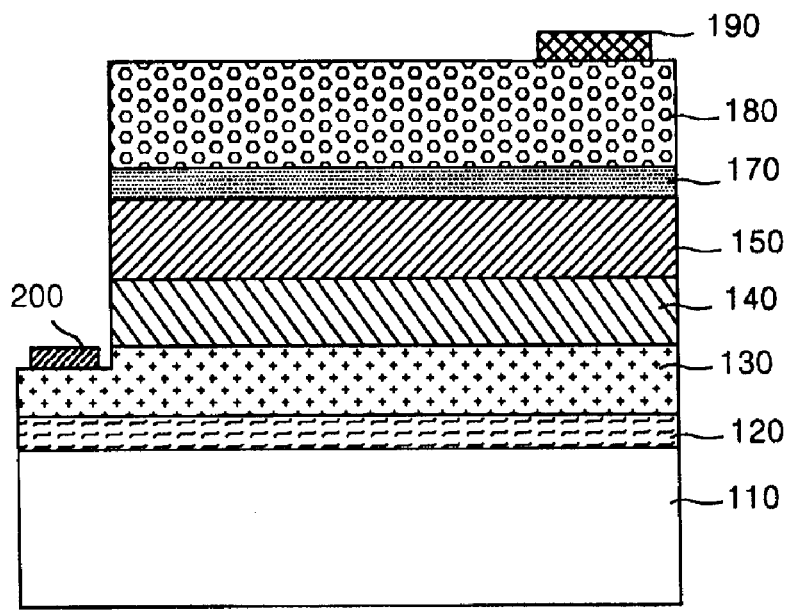
FIG. 1 is a cross-sectional view of a light emitting device in accordance with a first embodiment of the present invention.

FIG. 1 shows a cross-sectional view of a flip-chip nitride-based light emitting device in accordance with a first embodiment of the present invention.

Referring now to FIG. 1, the flip-chip nitride-based light emitting device is formed of a structure including a substrate 110, a buffer layer 120, an n-type clad layer 130, an active layer 140, a p-type clad layer 150, a transparent conductive thin film layer 170 and a reflective layer 180 sequentially stacked thereon. Reference numerals 190 and 200 represent a p-type electrode pad and an n-type electrode pad, respectively.

Parts from the substrate 110 to the p-type clad layer 150 correspond to a light emitting structure, and the transparent conductive thin film layer 170 stacked on the p-type clad layer 150 corresponds to an ohmic contact structure.

The substrate 110 is preferably formed of any one material selected from sapphire ($Al_2O_3$), silicon carbide (SiC), silicon (Si) and gallium arsenide (GaAs).

The buffer layer 120 may be omitted.

Respective layers from the buffer layer 120 to the p-type clad layer 150 are formed on the basis of any one compound selected from compounds represented by a general formula of Group III nitride-based compounds: $Al_xIn_yGa_zN$ ($0 \leq x \leq 1$, $0 \leq y \leq 1$, $0 \leq z \leq 1$, $0 \leq x+y+z \leq 1$). The n-type clad layer 130 and p-type clad layer 150 contain the corresponding dopants added thereto.

The active layer 140 may be configured so as to have a variety of known structures such as a monolayer or an MQW layer.

As an example, where a gallium nitride-based compound semiconductor is applied, the buffer layer 120 is formed of GaN, the n-type clad layer 130 is formed by adding n-type dopants such as Si, Ge, Se and Te to GaN, the active layer 140 is formed of InGaN/GaN MQW or AlGaN/GaN MQW, and the p-type clad layer 150 is formed by adding p-type dopants such as Mg, Zn, Ca, Sr and Ba to GaN.

An n-type ohmic contact layer (not shown) may be interposed between the n-type clad layer 130 and n-type electrode pad 200, and a variety of known structures such as a layer structure having titanium (Ti) and aluminum (Al) sequentially stacked thereon and the like may be applied as the n-type ohmic contact layer.

As the p-type electrode pad 190, a layer structure having nickel (Ni)/gold (Au) or silver (Ag)/gold (Au) sequentially stacked thereon may be applied.

Formation of the respective layers may be carried out via use of an e-beam evaporator, physical vapor deposition (PVD), chemical vapor deposition (CVD), plasma laser deposition (PLD), dual-type thermal evaporator sputtering or the like.

The transparent conductive thin film layer 170, which is applied as the ohmic contact structure, is formed of materials that inhibit diffusion of materials for the reflective layer 180 to be formed in a subsequent process into the p-type clad layer 150, thereby serving as a diffusion barrier to such materials while providing high-light transmittance and conductivity.

In addition, for the transparent conductive thin film layer 170, materials capable of increasing an effective carrier concentration of the p-type clad layer 150 and preferentially reactive with components other than nitrogen atoms among compounds constituting the p-type clad layer 150 are utilized.

For example, in the case of the light emitting device containing GaN-based compounds as the main component, materials which are more reactive with gallium (Ga) than nitrogen are utilized for the transparent conductive thin film layer 170.

In this case, as an example, the p-type clad layer 150 containing gallium nitride (GaN) as the main component forms gallium vacancies on the surface of the p-type clad layer 150, due to the transparent conductive thin film layer 170 having the above-mentioned properties, that is via reaction between the p-type clad layer 150 and transparent conductive thin film layer 170. Herein, as gallium vacancies formed on the p-type clad layer 150 serve as p-type dopants, reaction between the p-type clad layer 150 and transparent conductive thin film layer 170 leads to an increase in an effective carrier concentration on the surface of the p-type clad layer 150.

Further, for the transparent conductive thin film layer 170, there may be utilized materials capable of reducing gallium oxide ($Ga_2O_3$), which is a native oxide layer remaining on the surface of the p-type clad layer 150 while serving as a barrier to flow of carriers at the interface between the transparent conductive thin film layer 170 and p-type clad layer 150, thereby reducing height and width of the Schottky barrier.

As the material for the transparent conductive thin film layer 170 capable of satisfying such conditions, transparent conductive oxides (TCOs) or transparent conductive nitrides (TCNs) may be applied.

As the transparent conductive oxides, there may be applied combined materials of at least one component selected from indium (In), tin (Sn), zinc (Zn), gallium (Ga), cadmium (Cd), magnesium (Mg), beryllium (Be), silver (Ag), molybdenum (Mo), vanadium (V), copper (Cu), iridium (Ir), rhodium (Rh), ruthenium (Ru), tungsten (W), cobalt (Co), nickel (Ni), manganese (Mn), palladium (Pd), platinum (Pt), and lanthanum (La) with oxygen.

In addition, the transparent conductive nitrides include those nitrides having low sheet resistance and high light-transmittance and containing at least titanium (Ti) and nitrogen (N). As an example, mention may be made of titanium nitride (TiN) or titanium nitride oxide (Ti—N—O).

In order to improve electrical properties, at least one metal element of the Periodic Table, as the dopant, may be added to the transparent conductive oxides or transparent conductive nitrides.

Preferably, a ratio of the dopant, which is added to the transparent conductive oxides or transparent conductive nitrides, is within the range of 0.001 to 20 wt %. Herein, wt % refers to a weight ratio between materials added.

The material for the transparent conductive thin film layer 170 is selected taking into consideration the work function and sheet resistance depending upon uses of light emitting devices to be applied.

The thickness of the transparent conductive thin film layer 170 is preferably in the range of 1 nm to 1,000 nm so as to have proper light-transmittance and electrical conductivity.

Figure 5:
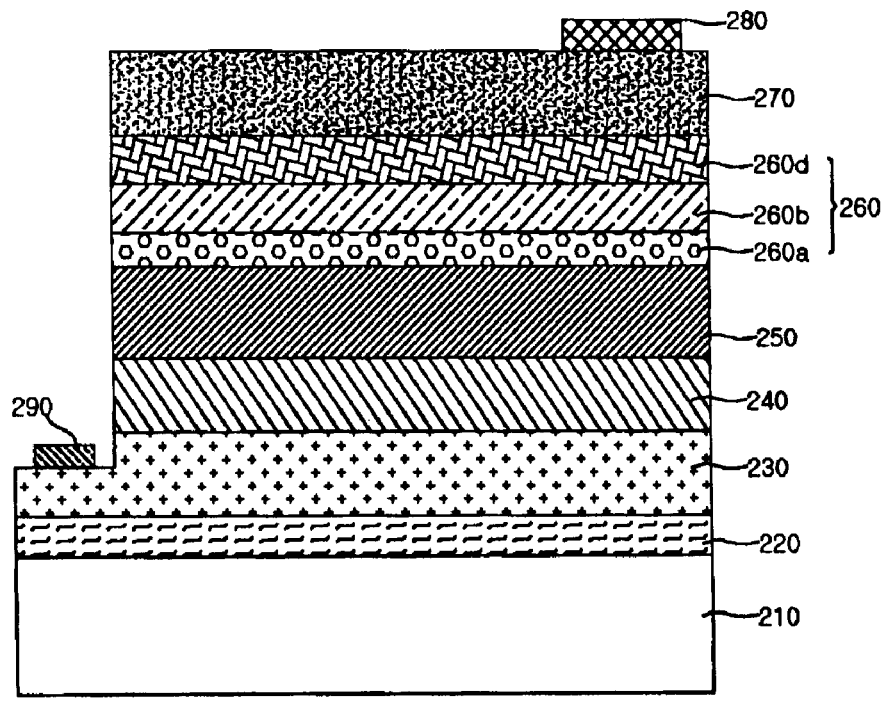
FIG. 5 is a cross-sectional view of a light emitting device in accordance with a fifth embodiment of the present invention.

Such a transparent conductive thin film layer 170 preferably takes the form of a monolayer or a multi-layer structure composed of two or more layers. An example thereof is shown in FIG. 5.

The reflective layer 180 is formed of materials having high reflectivity, for example, at least one material selected from silver (Ag), silver oxide ($Ag_2O$), aluminum (Al), zinc (Zn), titanium (Ti), rhodium (Rh), magnesium (Mg), palladium (Pd), ruthenium (Ru) and platinum (Pt).

In accordance with another aspect of the present invention, the reflective layer 180 is formed of an alloy which contains silver (Ag) as the main component and in which less than 5 wt % of at least one element selected from aluminum (Al), silver oxide ($Ag_2O$), zinc (Zn), titanium (Ti), rhodium (Rh), magnesium (Mg), palladium (Pd), ruthenium (Ru), platinum (Pt) and iridium (Ir) is to be contained in silver, or a solid solution thereof. Such a silver (Ag)-based alloy alleviates poor adhesion and thermal instability exhibited by silver (Ag) when used alone, thereby providing excellent contactability and thermal durability as well as maintaining high light-reflectivity.

The reflective layer 180 is formed of a thick film having a thickness of 100 nm to 1000 nm, in order to provide suitable reflectivity. Preferably, the reflective layer 180 is deposited utilizing the above-mentioned materials and then is annealed.

In the light emitting device having such a structure, when the transparent conductive thin film layer 170 is formed using the above-mentioned materials and then is annealed at a suitable temperature under oxygen or air atmosphere, this layer 170 becomes a transparent conductive material having high light-transmittance, i.e., transmittance of more than 90% at a wavelength of 400 nm and a low sheet resistance value (less than 10 Ω/unit area) and at the same time reduces gallium oxide ($Ga_2O_3$), which is a native oxide layer remaining on the surface of the p-type clad layer 150 while serving as a barrier to flow of carriers at the interface between the transparent conductive thin film layer 170 and p-type clad layer 150, thereby reducing height and width of the Schottky barrier, induces tunneling effects that are advantageous for formation of ohmic contact, thereby improving electrical properties, and has light-transmittance close to 100%.

In addition, the transparent conductive thin film layer 170, when the reflective layer 180 is formed of the foregoing materials, inhibits diffusion/contact of materials constituting the reflective layer into/with the p-type clad layer 150.

Figure 2:
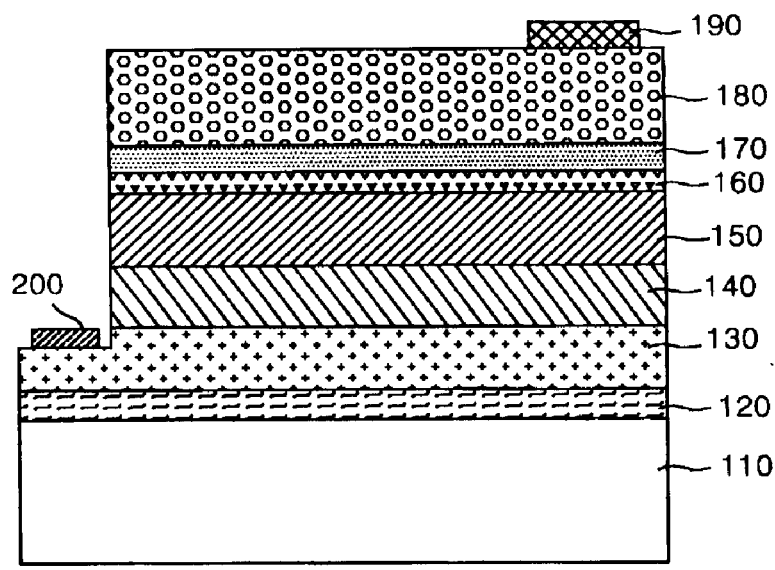
FIG. 2 is a cross-sectional view of a light emitting device in accordance with a second embodiment of the present invention.

FIG. 2 shows a cross-sectional view of a flip-chip nitride-based light emitting device in accordance with another embodiment of the present invention. For elements having the same function as in the previously shown drawing, like numbers refer to like elements hereinafter.

Referring now to FIG. 2, the light emitting device is formed of a structure including a substrate 110, a buffer layer 120, an n-type clad layer 130, an active layer 140, a p-type clad layer 150, an interface modification layer 160, a transparent conductive thin film layer 170 and reflective layer 180 sequentially stacked thereon.

The interface modification layer 160 is applied to improve ohmic contact between the p-type clad layer 150 and transparent conductive thin film layer 170.

As the interface modification layer 160, there are applied materials having electrical conductivity while capable of being easily decomposed into conductive nano-phase oxide particles, or capable of forming the transparent conductive thin film layer, upon annealing at a temperature of less than 800° C. under a variety of gas atmospheres such as oxygen, nitrogen and argon and at the same time, reducing a native oxide layer, i.e., gallium oxide ($Ga_2O_3$), formed thinly on the upper part of the p-type clad layer 150 or converting the gallium oxide layer into a conductive oxide layer.

Materials for the interface modification layer 160 satisfying such conditions can be selected from various materials as below:

1) Any one element selected from indium (In), tin (Sn), zinc (Zn), magnesium (Mg), silver (Ag), iridium (Ir), ruthenium (Ru), rhodium (Rh), platinum (Pt), nickel (Ni) and palladium (Pd), alloys containing at least one selected from the foregoing elements, and solid solutions thereof.

1-1) Materials which are formed of any one of indium among the foregoing elements, alloys to which additional elements are added while containing indium as a main component and solid solutions thereof, are preferred for the interface modification layer. Herein, additional elements added to indium as the material applied to the interface modification layer include at least one selected from tin (Sn), zinc (Zn), gallium (Ga), cadmium (Cd), magnesium (Mg), beryllium (Be), silver (Ag), molybdenum (Mo), vanadium (V), copper (Cu), iridium (Ir), rhodium (Rh), ruthenium (Ru), tungsten (W), cobalt (Co), nickel (Ni), manganese (Mn), palladium (Pd), platinum (Pt) and lanthanum (La). The ratio of the additional element added relative to indium is not particularly limited, but is preferably within the range of 0.001 to 50 wt %.

1-2) Materials which are formed of any one of tin among the foregoing elements, alloys to which additional elements are added while containing tin as a main component and solid solutions thereof, are also preferred for the interface modification layer. Herein, additional elements added to tin as the material applied to the interface modification layer include at least one selected from indium (In), zinc (Zn), gallium (Ga), cadmium (Cd), magnesium (Mg), beryllium (Be), silver (Ag), molybdenum (Mo), vanadium (V), copper (Cu), iridium (Ir), rhodium (Rh), ruthenium (Ru), tungsten (W), cobalt (Co), nickel (Ni), manganese (Mn), palladium (Pd), platinum (Pt) and lanthanum (La). The ratio of the additional element added relative to tin is not particularly limited, but is preferably within the range of 0.001 to 50 wt %.

2) P-type transparent conductive oxides

For the interface modification layer 160, there are applied materials capable of providing a hole concentration of the p-type transparent conductive oxide, formed on the upper part of the p-type clad layer 150, in the range of $10^{15}$ to $10^{18}/cm^3$, such that height and width of the Schottky barrier, which is formed between p-type clad layer 150 and the interface modification layer 160, can be reduced.

2-1) As examples of the p-type transparent conductive oxides, binary or ternary oxides formed of at least one element selected from Group II elements including magnesium (Mg), zinc (Zn) and beryllium (Be) are preferred.

2-2) As examples of the p-type oxides, any one oxide selected from $Ag_2O$, $CuAlO_2$, $SrCu_2O_2$, $LaMnO_3$, $LaNiO_3$ and $In_xO_{1-x}$, is preferred.

P-type dopants may be suitably added to the p-type oxides, such that the concentration and work function of the p-type transparent conductive oxides can be controlled and at the same time, height and width of the Schottky barrier can be reduced.

In addition, besides the above-mentioned p-type transparent conductive oxides, there may be applied a material in which an electron concentration of transparent conductive nano-phase particles or thin film layer formed on the upper part of the p-type clad layer 150 is capable of providing a value of $10^{15}$ to $10^{17}/cm^3$, such that height and width of the Schottky barrier, which is formed between the p-type clad layer 150 and the interface modification layer 160, can be reduced.

2-3) Among the above-mentioned materials, indium-based oxides, tin-based oxides, or zinc-based oxides are preferred.

In the case of indium-based oxides, additional elements capable of adjusting the concentration and work function of indium oxide ($In_2O_3$) and simultaneously capable of reducing the height and width of the Schottky barrier are preferably added to indium oxide ($In_2O_3$) that is a main component. As the additional elements, mention may be made of at least one component selected from gallium (Ga), magnesium (Mg), beryllium (Be), molybdenum (Mo), vanadium (V), copper (Cu), iridium (Ir), rhodium (Rh), ruthenium (Ru), tungsten (W), cobalt (Co), nickel (Ni), manganese (Mn) and lanthanum (La).

In the case of tin-based oxides, additional elements capable of adjusting the concentration and work function of tin oxide and at the same time, capable of reducing the height and width of the Schottky barrier are preferably further added to tin oxide. As the additional elements, mention may be made of at least one component selected from zinc (Zn), gallium (Ga), magnesium (Mg), beryllium (Be), molybdenum (Mo), vanadium (V), copper (Cu), iridium (Ir), rhodium (Rh), ruthenium (Ru), tungsten (W), cobalt (Co), nickel (Ni), manganese (Mn) and lanthanum (La).

In the case of zinc-based oxides, additional elements capable of adjusting the concentration and work function of zinc oxide and simultaneously capable of reducing the height and width of the Schottky barrier are preferably further added to zinc oxide. As the additional elements that can be added, mention may be made of at least one component selected from indium (In), tin (Sn), gallium (Ga), magnesium (Mg), beryllium (Be), molybdenum (Mo), vanadium (V), copper (Cu), iridium (Ir), rhodium (Rh), ruthenium (Ru), tungsten (W), cobalt (Co), nickel (Ni), manganese (Mn) and lanthanum (La).

In this connection, the ratio of the additional element added relative to the above-mentioned main components is not particularly limited, but is preferably within the range of 0.001 to 50 wt %. Herein, wt % refers to a weight ratio between materials added.

The interface modification layer 160 made up of the above-mentioned materials is preferably formed to a thickness of 0.1 nm to 100 nm at which the interface modification layer 160 can be easily decomposed into a conductive nano-phase oxide, or is capable of forming a thin film layer through which quantum tunneling of carriers can be effected, upon annealing.

The transparent conductive oxide 170 is formed of the above-mentioned materials.

Such a structure of the multi-ohmic contact layer and reflective layer 180 prevents surface degradation occurring at temperatures of more than 200° C., is stable against oxidization and still has high reflectivity, thereby making it possible to realize high-efficiency light emitting devices.

Hereinafter, processes for preparing light emitting devices having structures in accordance with the first and second embodiments of the present invention will be described with reference to FIGS. 1 and 2.

Firstly, a buffer layer 120, an n-type clad layer 130, an active layer 140 and a p-type clad layer 150 are sequentially stacked on a substrate 110.

Next, in order to secure a space for formation of an n-type electrode pad 200, a region ranging from the p-type clad layer 150 to the n-type clad layer 130 was partially etched to form a MESA structure.

Then, where the structure of FIG. 1 is applied, a transparent conductive thin film layer 170 alone is formed on the p-type clad layer 150, and where the structure of FIG. 2 is applied, the interface modification layer 160 and the transparent conductive thin film layer 170 are sequentially formed on the p-type clad layer 150.

The transparent conductive thin film layer 170 or the interface modification layer 160 and transparent conductive thin film layer 170 are formed via use of known deposition methods such as e-beam evaporation, physical vapor deposition (PVD), chemical vapor deposition (CVD), plasma laser deposition (PLD), dual-type thermal evaporator sputtering or the like.

The deposition temperature is in the range of 20° C. to 1500° C. and internal pressure of the evaporator is in the range of atmospheric pressure to $10^{-12}$ torr.

After formation of the transparent conductive thin film layer 170, or the interface modification layer 160 and transparent conductive thin film layer 170, on the p-type clad layer 150, the resulting structure is preferably annealed under gaseous atmosphere containing oxygen, i.e., oxygen atmosphere or air.

Annealing is carried out at a temperature of 100° C. to 800° C. in a reactor for 10 sec to 3 hours.

Thereafter, the reflective layer 180 is formed on the transparent conductive thin film layer 170. The reflective layer 180 is deposited via known deposition methods as mentioned above.

In order to improve adhesion and thermal stability of the reflective layer 180 after formation thereof, the light emitting structure is annealed at a temperature of 100° C. to 800° C. in a reactor under vacuum, nitrogen or argon gas atmosphere for 10 sec to 3 hours.

It was confirmed through experiments that annealing of the reflective layer 180 under atmosphere other than vacuum, nitrogen and argon results in degradation of characteristics thereof.

Figure 3:
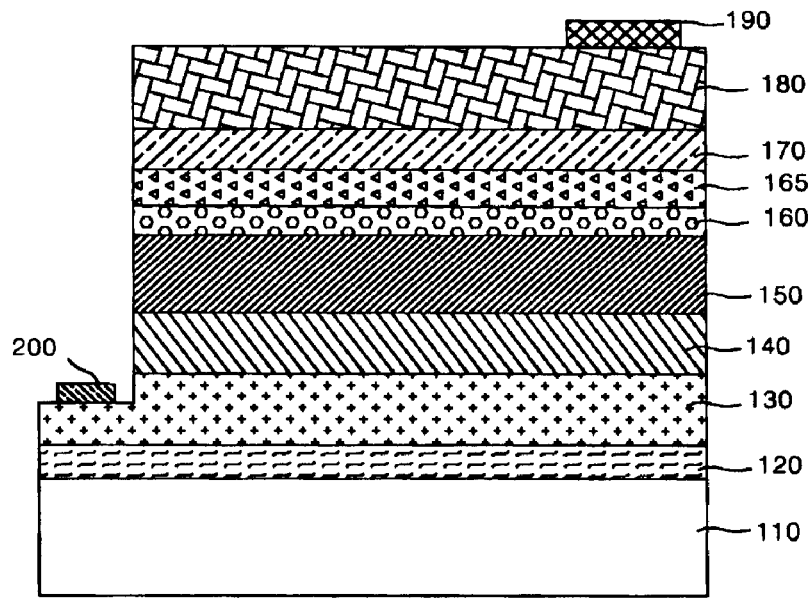
FIG. 3 is a cross-sectional view of a light emitting device in accordance with a third embodiment of the present invention.

FIG. 3 shows a cross-sectional view of a flip-chip nitride-based light emitting device in accordance with a third embodiment of the present invention. For elements having the same function as in the previously shown drawing, like numbers refer to like elements hereinafter.

Referring now to FIG. 3, the flip-chip light emitting device is formed of a structure including a substrate 110, a buffer layer 120, an n-type clad layer 130, an active layer 140, a p-type clad layer 150, an interface modification layer 160, an insert metal layer 165, a transparent conductive thin film layer 170 and a reflective layer 180 sequentially stacked thereon.

Herein, the interface modification layer 160, insert metal layer 165 and transparent conductive thin film layer 170 correspond to a multi-ohmic contact layer.

The insert metal layer 165 is formed between the interface modification layer 160 and transparent conductive thin film layer 170.

The insert metal layer 165 is preferably made up of a metal that is easily transformed into a transparent conductive oxide upon annealing and, at the same time, is capable of adjusting electrical or optical properties of the interface modification layer 160 or the transparent conductive thin film layer 170 that will be formed on the upper part of the interface modification layer 160 in a subsequent process.

Preferably, the insert metal layer 165 is formed of at least one component selected from zinc (Zn), indium (In), tin (Sn), nickel (Ni), magnesium (Mg), gallium (Ga), copper (Cu), beryllium (Be), iridium (Ir), ruthenium (Ru) and molybdenum (Mo).

The insert metal layer 165 may of course be formed of multi-layers using the above-enumerated materials.

Preferably, the insert metal layer 165 is formed to a thickness of 1 nm to 100 nm.

Hereinafter, processes for preparing a light emitting device having a structure in accordance with the third embodiment of the present invention will be described with reference to FIG. 3.

Firstly, a buffer layer 120, an n-type clad layer 130, an active layer 140 and a p-type clad layer 150 are sequentially deposited on a substrate 110, thereby forming a light emitting structure.

Next, in order to secure a space for formation of an n-type electrode pad 200, a region ranging from the p-type clad layer 150 to the n-type clad layer 130 was partially etched to form a MESA structure.

Next, a multi-ohmic contact layer including an interface modification layer 160, an insert metal layer 165 and a transparent conductive thin film layer 170 sequentially stacked on the p-type clad layer 150 is formed.

The interface modification layer 160, insert metal layer 165 and transparent conductive thin film layer 170 are formed via use of known deposition methods such as e-beam evaporation, physical vapor deposition (PVD), chemical vapor deposition (CVD), plasma laser deposition (PLD), dual-type thermal evaporator sputtering or the like.

In addition, a deposition temperature which is applied for sequential formation of layers from the interface modification layer 160 to transparent conductive thin film layer 170 is in the range of 20° C. to 1500° C. and internal pressure of the evaporator is in the range of atmospheric pressure to $10^{-12}$ ton.

Preferably, formation of layers from the interface modification layer 160 to transparent conductive thin film layer 170 is followed by an annealing process.

Annealing is carried out at a temperature of 100° C. to 800° C. in a reactor under vacuum or suitable gas atmosphere for 10 sec to 3 hours.

As the gas introduced to the reactor upon annealing, at least one gas selected from nitrogen, argon, helium, oxygen, hydrogen and air may be applied.

After annealing, the reflective layer 180 is formed on the transparent conductive thin film layer 170 using the previously-explained materials.

The reflective layer 180 is deposited via the previously-mentioned deposition methods.

In order to improve adhesion and thermal stability of the reflective layer 180 after formation thereof, the light emitting structure is annealed via the method as described above.

Alternatively, layers from the interface modification layer 160 to the reflective layer 180 are sequentially deposited on the p-type clad layer 150 and then the light emitting structure can be annealed once only.

It was confirmed through experiments that when first annealing is carried out after formation of layers up to the transparent conductive thin film layer 170 and second annealing is carried out after formation of the reflective layer 180, light transmittance of the multi-ohmic contact layer is further increased and reflectivity of the reflective layer 180 is increased.

Hereinafter, processes for preparing a light emitting device having structures in accordance with the fourth and fifth embodiments of the present invention will be described with reference to FIGS. 4 and 5.

Figure 4:
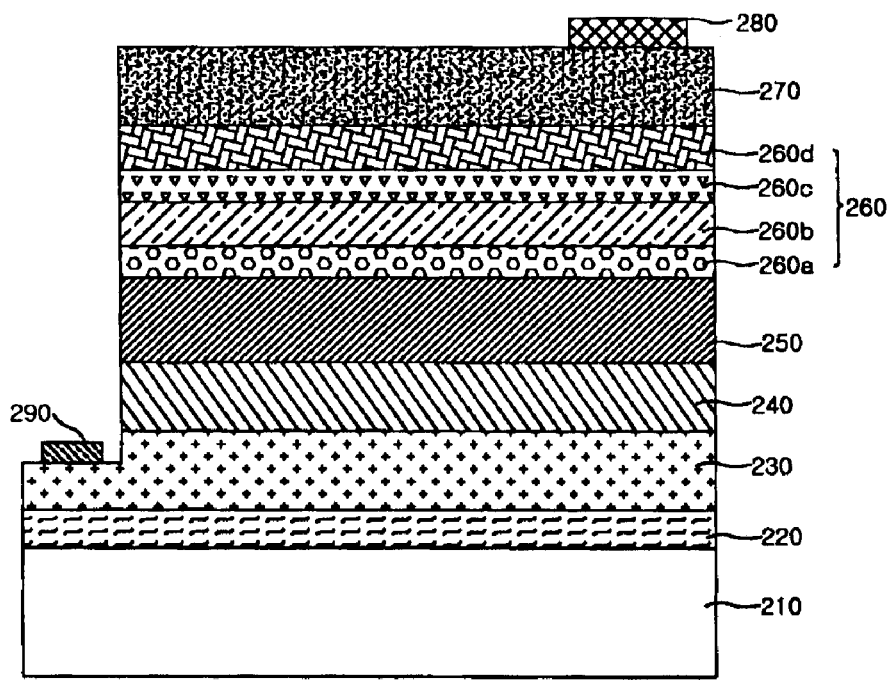
FIG. 4 is a cross-sectional view of a light emitting device in accordance with a fourth embodiment of the present invention.

FIG. 4 shows a cross-sectional view of a flip-chip light emitting device in accordance with the fourth embodiment of the present invention. Referring now to FIG. 4, the flip-chip light emitting device is formed of a structure including a substrate 210, a buffer layer 220, an n-type clad layer 230, an active layer 240, a p-type clad layer 250, a multi-ohmic contact layer 260 and a reflective layer 270 sequentially stacked thereon. Reference numerals 280 and 290 represent a p-type electrode pad and an n-type electrode pad, respectively.

Since the constituents of such a flip-chip light emitting device are substantially the same as in the first embodiment, except for the multi-ohmic contact layer 260, the detailed description thereof will be omitted. Hereinafter, the multi-ohmic contact layer 260 will be described.

The multi-ohmic contact layer 260 is formed by repeatedly stacking an interface modification layer 260a/transparent conductive thin film layer 260b as a stack unit. An example of such a repeatedly stacked structure is shown in FIG. 4.

Referring now to FIG. 4, the multi-ohmic contact layer 260 is formed of a structure including the first interface modification layer 260a/first transparent conductive thin film layer 260b/second interface modification layer 260c/second transparent conductive thin film layer 260d sequentially stacked thereon.

The first interface modification layer 260a and first transparent conductive thin film layer 260b may be formed according to the procedure as described for the interface modification layer 160 and transparent conductive thin film layer 170 in the first through third embodiments of the present invention.

Upon annealing, the second interface modification layer 260c is supplied with oxygen from the first transparent conductive thin film layer 260b or from the second transparent conductive thin film layer 260d that will be formed in a subsequent process and forms a transparent conductive oxide thin film layer, and at the same time, further increases carrier concentrations of the first and second transparent conductive thin film layers 260b and 260d.

In order to lower sheet resistance, materials applied to the second interface modification layer 260c may be identical to or different from components of the first interface modification layer 260a.

Preferably, the first and second interface modification layers 260a and 260c are, respectively, formed to a thickness of 0.1 nm to 100 nm at which those layers can be easily decomposed and oxidized into conductive nano-phase particles upon annealing.

In addition, the first transparent conductive thin film layer 260b and second transparent conductive thin film layer 260d may also be formed of the above-mentioned materials, but components of the first transparent conductive thin film layer 260b may be identical to or different from components of the second transparent conductive thin film layer 260d, in order to lower sheet resistance.

The first transparent conductive thin film layer 260b and second transparent conductive thin film layer 260d are also independently formed to a thickness of 1 nm to 1000 nm, as described above.

Meanwhile, a light emitting device to which another multi-ohmic contact layer is applied is shown in FIG. 5. For elements having the same function as in the previously shown drawing, like numbers refer to like elements hereinafter.

Referring now to FIG. 5, the multi-ohmic contact layer 260 is formed of a structure including a first interface modification layer 260a/first transparent Conductive thin film layer 260b/second transparent conductive thin film layer 260d sequentially stacked thereon.

Herein, a stack repeat unit is the first interface modification layer 260a/first transparent conductive thin film layer 260b/second transparent conductive thin film layer 260d.

In the multi-ohmic contact layer 260 having such a structure, the first interface modification layer 260a/first transparent conductive thin film layer 260b/second transparent conductive thin film layer 260d may be formed using the materials and methods as described hereinbefore.

Hereinafter, processes for preparing light emitting devices having structures in accordance with the fourth and fifth embodiments of the present invention will be described with reference to FIGS. 4 and 5.

Firstly, a buffer layer 220, an n-type clad layer 230, an active layer 240 and a p-type clad layer 250 are sequentially deposited on a substrate 210, thereby forming a light emitting structure.

Next, in order to secure a space for formation of an n-type electrode pad 290, layers from the p-type clad layer 250 to the n-type clad layer 230 are partially etched to form a MESA structure.

Then, a multi-ohmic contact layer 260 is formed on the p-type clad layer 250 of the light emitting structure.

The respective layers constituting the multi-ohmic contact layer 260 may be formed via use of known deposition methods such as e-beam evaporation, physical vapor deposition (PVD), chemical vapor deposition (CVD), plasma laser deposition (PLD), a dual-type thermal evaporator sputtering.

In addition, a deposition temperature which is applied for sequential formation of the respective layers of the multi-ohmic contact layer 260 is in the range of 20° C. to 1500° C. and internal pressure of the evaporator is in the range of atmospheric pressure to $10^{-12}$ ton.

Preferably, formation of the multi-ohmic contact layer 260 is followed by an annealing process.

Annealing is carried out at a temperature of 100° C. to 800° C. in a reactor under vacuum or suitable gas atmosphere for 10 sec to 3 hours.

As the gas introduced to the reactor upon annealing, at least one gas selected from nitrogen, argon, helium, oxygen, hydrogen and air may be applied.

After annealing, the reflective layer 270 is formed on the multi-ohmic contact layer 260, utilizing the previously-exemplified materials.

The reflective layer 270 is deposited via the previously-mentioned deposition methods.

In order to improve adhesion and thermal stability of the reflective layer 270 after formation thereof, the light emitting structure is annealed via the method as described previously.

Alternatively, after sequential formation of the multi-ohmic contact layer 260 and reflective layer 270 on the p-type clad layer 250, the resulting light emitting structure may be annealed once only.

It was confirmed through experiments that when first annealing is carried out after formation of the multi-ohmic contact layer 260 and second annealing is carried out after formation of the reflective layer 270, light transmittance of the multi-ohmic contact layer 260 is further increased and reflectivity of the reflective layer 270 is increased.

Experimental results on determination of characteristics of the light emitting device, fabricated according to the process of the present invention as described above, are shown in FIGS. 6 and 7.

Figure 6:
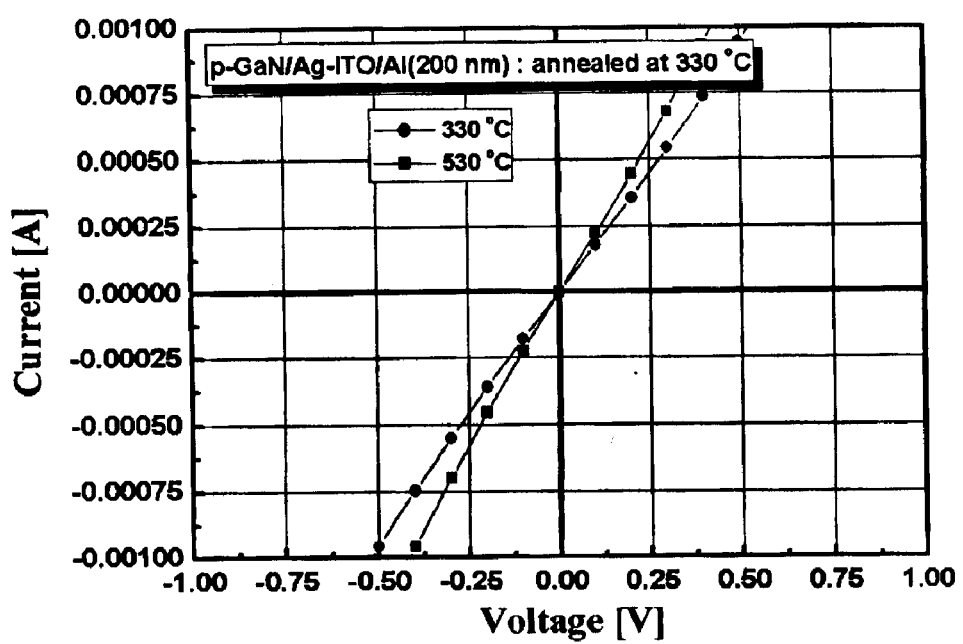
FIG. 6 is a graph showing results of current-voltage properties determined for a light emitting device from which a reflective layer is omitted.

FIG. 6 is a graph showing results of current-voltage properties determined for the light emitting device manufactured by sequentially stacking Ag/ITO on the upper part of the p-type clad layer, followed by annealing at a temperature of 330° C. to 530° C. under air atmosphere.

Figure 7:
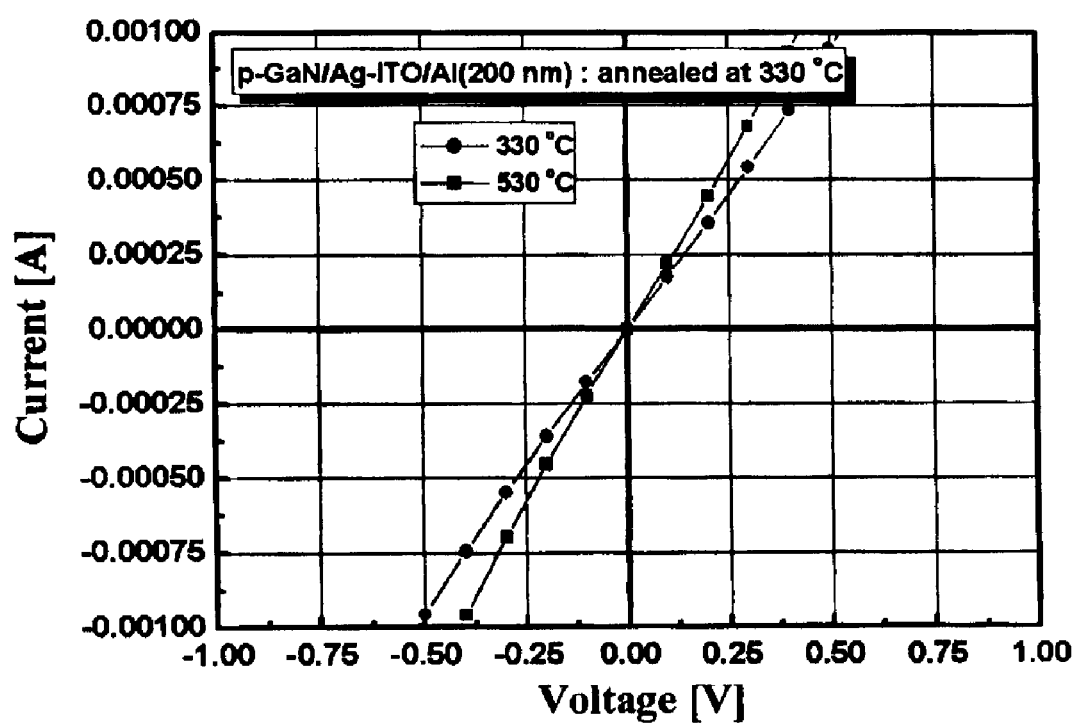
FIG. 7 is a graph showing results of current-voltage properties determined for a light emitting device in accordance with the present invention.

FIG. 7 is a graph showing results of current-voltage properties determined for the light emitting device manufactured by sequentially stacking Ag/ITO on the upper part of the p-type clad layer followed by annealing at a temperature of 330° C. to 530° C. under air atmosphere, and depositing an aluminum reflective layer followed by annealing at a temperature of 330° C. under vacuum.

As can be seen from comparison between FIGS. 6 and 7, the light emitting structure, fabricated by further forming the reflective layer using aluminum followed by annealing, exhibited improved current-voltage driving characteristics.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

The invention claimed is:

1. A process for preparing a flip-chip nitride-based light emitting device having an active layer between an n-type clad layer and a p-type clad layer, comprising:
  a) forming at least one transparent conductive thin film layer on the p-type clad layer of a light emitting structure including the n-type clad layer, active layer and p-type clad layer sequentially stacked on a substrate;
  b) forming a reflective layer on the transparent conductive thin film layer; and
  c) annealing the resulting structure including the reflective layer.

2. The process according to claim 1, further comprising:
  an annealing step after step a) prior to forming the reflective layer.

3. A process for preparing a flip-chip nitride-based light emitting device having an active layer between an n-type clad layer and a p-type clad layer, comprising:
  a) forming an interface modification layer on the p-type clad layer of a light emitting structure including the n-type clad layer, active layer and p-type clad layer sequentially stacked on a substrate;
  b) forming at least one transparent conductive thin film layer made up of transparent conductive materials on the interface modification layer;
  c) forming a reflective layer on the transparent conductive thin film layer; and
  d) annealing the structure formed in step c).

4. The process according to claim 3, further comprising:
  an annealing step after step b) prior to forming the reflective layer.

5. The process according to claim 3, further comprising:
  forming an insert metal layer on the interface modification layer prior to forming the transparent conductive thin film layer.

6. A process for preparing a flip-chip nitride-based light emitting device having an active layer between an n-type clad layer and a p-type clad layer, comprising:
  a) forming a multi-ohmic contact layer via stacking of an interface modification layer and at least one transparent conductive thin film layer, as a stack repeat unit, on the p-type clad layer of a light emitting structure including the n-type clad layer, active layer and p-type clad layer sequentially stacked on a substrate;
  b) forming a reflective layer on the multi-ohmic contact layer; and
  c) annealing the structure formed in step b).

7. The process according to claim 6, further comprising:
  annealing the multi-ohmic contact layer after step a) prior to forming the reflective layer.

* * * * *